US010900911B2

(12) United States Patent
Brabant et al.

(10) Patent No.: US 10,900,911 B2
(45) Date of Patent: Jan. 26, 2021

(54) VEHICLE CABIN INSPECTION SYSTEM AND METHOD

(71) Applicant: Smiths Heimann SAS, Vitry sur Seine (FR)

(72) Inventors: Agathe Brabant, Vitry sur Seine (FR); Guillaume Jegou, Vitry sur Seine (FR)

(73) Assignee: SMITHS HEIMANN SAS, Vitry-sur-Seine (FR)

( * ) Notice: Subject to any disclaimer, the term of this patent is extended or adjusted under 35 U.S.C. 154(b) by 110 days.

(21) Appl. No.: 15/769,928

(22) PCT Filed: Oct. 21, 2016

(86) PCT No.: PCT/GB2016/053304
§ 371 (c)(1),
(2) Date: Apr. 20, 2018

(87) PCT Pub. No.: WO2017/068370
PCT Pub. Date: Apr. 27, 2017

(65) Prior Publication Data
US 2019/0187324 A1 Jun. 20, 2019

(30) Foreign Application Priority Data
Oct. 21, 2015 (GB) .................... 1518678.6

(51) Int. Cl.
*G01N 23/10* (2018.01)
*G01V 5/00* (2006.01)
(Continued)

(52) U.S. Cl.
CPC ........... *G01N 23/10* (2013.01); *G01V 5/0016* (2013.01); *G01V 5/0041* (2013.01);
(Continued)

(58) Field of Classification Search
CPC ...... G01V 5/00; G01V 5/0008; G01V 5/0016; G01V 5/0041; G01V 5/0066;
(Continued)

(56) References Cited

U.S. PATENT DOCUMENTS

2004/0017887 A1* 1/2004 Le .................... G01N 23/04
378/57
2013/0039462 A1 2/2013 Morton
(Continued)

FOREIGN PATENT DOCUMENTS

CN 104198507 A 12/2014
CN 104391338 A 3/2015
(Continued)

OTHER PUBLICATIONS

Search Report for Application No. GB1518678.6 dated Jan. 25, 2016.
(Continued)

*Primary Examiner* — Anastasia Midkiff
(74) *Attorney, Agent, or Firm* — Kevin E. West; Advent, LLP

(57) ABSTRACT

An inspection system (100) having: • a source (101) configured to generate inspection radiation (40); • a collimator (103) configured to collimate the inspection radiation into an inspection beam (41) configured to irradiate a section of a vehicle (20); • a filter (102) located between the source and the collimator, the filter having at least a cargo configuration and an attenuation configuration; and • a controller (104) configured to control the configuration of the filter, such that the filter is in the cargo configuration when the inspection beam irradiates a container (23), and in the attenuation configuration when the inspection beam irradiates a cabin (21).

20 Claims, 9 Drawing Sheets

(51) Int. Cl.
*G21K 1/10* (2006.01)
*H01J 37/02* (2006.01)

(52) U.S. Cl.
CPC ............. *G01V 5/0066* (2013.01); *G21K 1/10* (2013.01); *H01J 37/023* (2013.01); *G01N 2223/206* (2013.01); *G01N 2223/3032* (2013.01); *G01N 2223/313* (2013.01); *G01N 2223/32* (2013.01); *G01N 2223/3308* (2013.01); *G01N 2223/41* (2013.01); *G01N 2223/639* (2013.01)

(58) Field of Classification Search
CPC .......... G01V 5/0083; G21K 1/00; G21K 1/10; G21K 5/00; G21K 5/04; G21K 5/10; H05G 1/00; H05G 1/02; H05G 1/08; H05G 1/085; H05G 1/26; H05G 1/30; H05G 1/32; H05G 1/38; H05G 1/40; H05G 1/56; G01N 21/17; G01N 21/90; G01N 21/909; G01N 23/02; G01N 23/04; G01N 23/06; G01N 23/083; G01N 23/10; G01N 2291/028; G01N 2291/0289; G01N 2291/052; G01N 2291/2695; G01N 2021/1717; G01N 2021/1765; G01N 2021/177; G01N 2021/1772; G01N 2021/1793; G01N 2021/845; G01N 2021/8455; G01N 2021/9036; G01N 2223/00; G01N 2223/03; G01N 2223/04; G01N 2223/101; G01N 2223/1016; G01N 2223/20; G01N 2223/206; G01N 2223/30; G01N 2223/302; G01N 2223/303; G01N 2223/3032; G01N 2223/304; G01N 2223/306; G01N 2223/313; G01N 2223/32; G01N 2223/321; G01N 2223/33; G01N 2223/3308; G01N 2223/40; G01N 2223/41; G01N 2223/631; G01N 2223/639; G01N 2223/66; H01J 35/00; H01J 35/02; H01J 35/025; H01J 37/00; H01J 37/02; H01J 37/023; H01J 37/09; H01J 37/15; H01J 37/22; H01J 2237/05; H01J 2237/057; H01J 2237/06; H01J 2237/061; H01J 2237/065; H01J 2237/0653; H01J 2237/083; H01J 2237/20; H01J 2237/202; H01J 2237/20221; H01J 2237/20235; H01J 2237/2025; H01J 2237/20278; H01J 2237/248; H01J 2237/2482
See application file for complete search history.

(56) References Cited

U.S. PATENT DOCUMENTS

| | | | |
|---|---|---|---|
| 2014/0016756 A1* | 1/2014 | Kotowski | G01N 23/04 378/147 |
| 2014/0192958 A1 | 7/2014 | Dinca et al. | |
| 2014/0233707 A1 | 8/2014 | Grodzins et al. | |
| 2015/0219785 A1* | 8/2015 | Tudor | G01V 5/0016 378/57 |

FOREIGN PATENT DOCUMENTS

| | | |
|---|---|---|
| CN | 204287511 U | 4/2015 |
| WO | 2012106730 A2 | 8/2012 |

OTHER PUBLICATIONS

International Search Report dated May 9, 2017 for PCT/GB2016/053304.

* cited by examiner

VEHICLE CABIN INSPECTION SYSTEM AND METHOD

FIELD OF INVENTION

The present disclosure relates, but is not limited, to systems and methods for inspecting a vehicle comprising a cabin configured to be occupied by a user.

BACKGROUND

Inspection systems use inspection radiation through vehicles for inspecting cargo of the vehicle, for example to detect hidden objects (such as weapons or dangerous material).

Strict regulations limit the dose to which users of the vehicles may be exposed. In a "scanning" mode of inspection, the drivers of the vehicles usually step down of the vehicles in order to avoid being irradiated and the inspection systems move with respect to the vehicles to inspect them. The scanning mode has a relatively small overall vehicle flow rate of inspection (around 20 or 25 vehicles per hour), and the inspection systems are relatively expensive because they must be configured to be mobile. In a "pass-through" mode of inspection, the drivers may stay in the vehicles, but radiation emission only starts once the cabin has passed a zone of inspection. The pass-through mode has a greater overall vehicle flow rate of inspection (between 100 and 200 vehicles per hour), but the cabin is not inspected, which prevents detection of hidden objects in the cabin.

Aspects of the present invention address some of the above issues.

SUMMARY OF INVENTION

Aspects and embodiments of the invention are set out in the appended claims. These and other aspects and embodiments of the invention are also described herein.

PRESENTATION OF THE FIGURES

Embodiments of the disclosure will now be described, by way of example only, with reference to the accompanying drawings, in which.

Figure 7B:
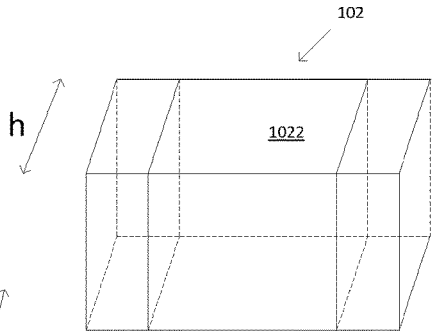
Figure 7A:
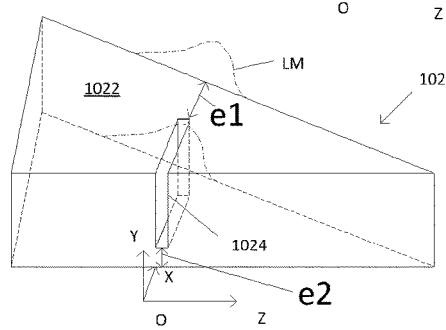
Figure 6A:
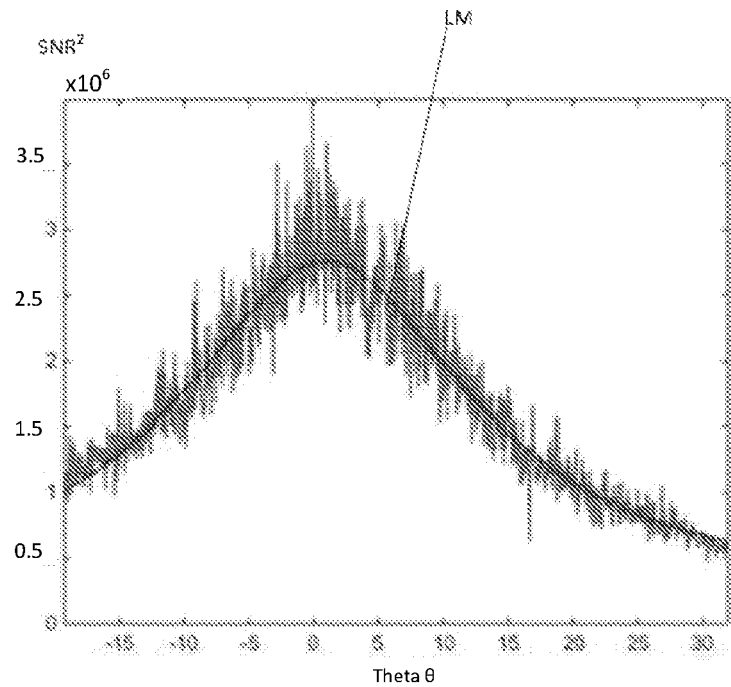
Figure 6B:
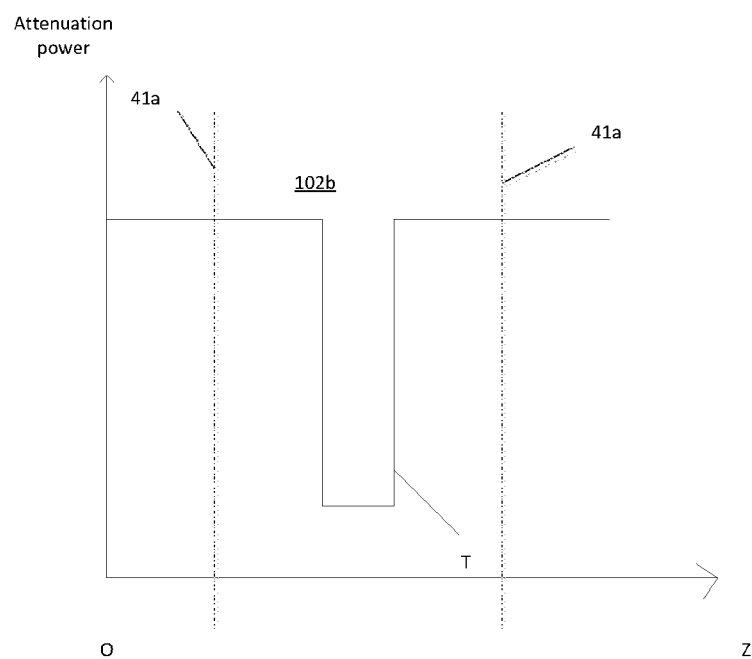
Figure 8A:
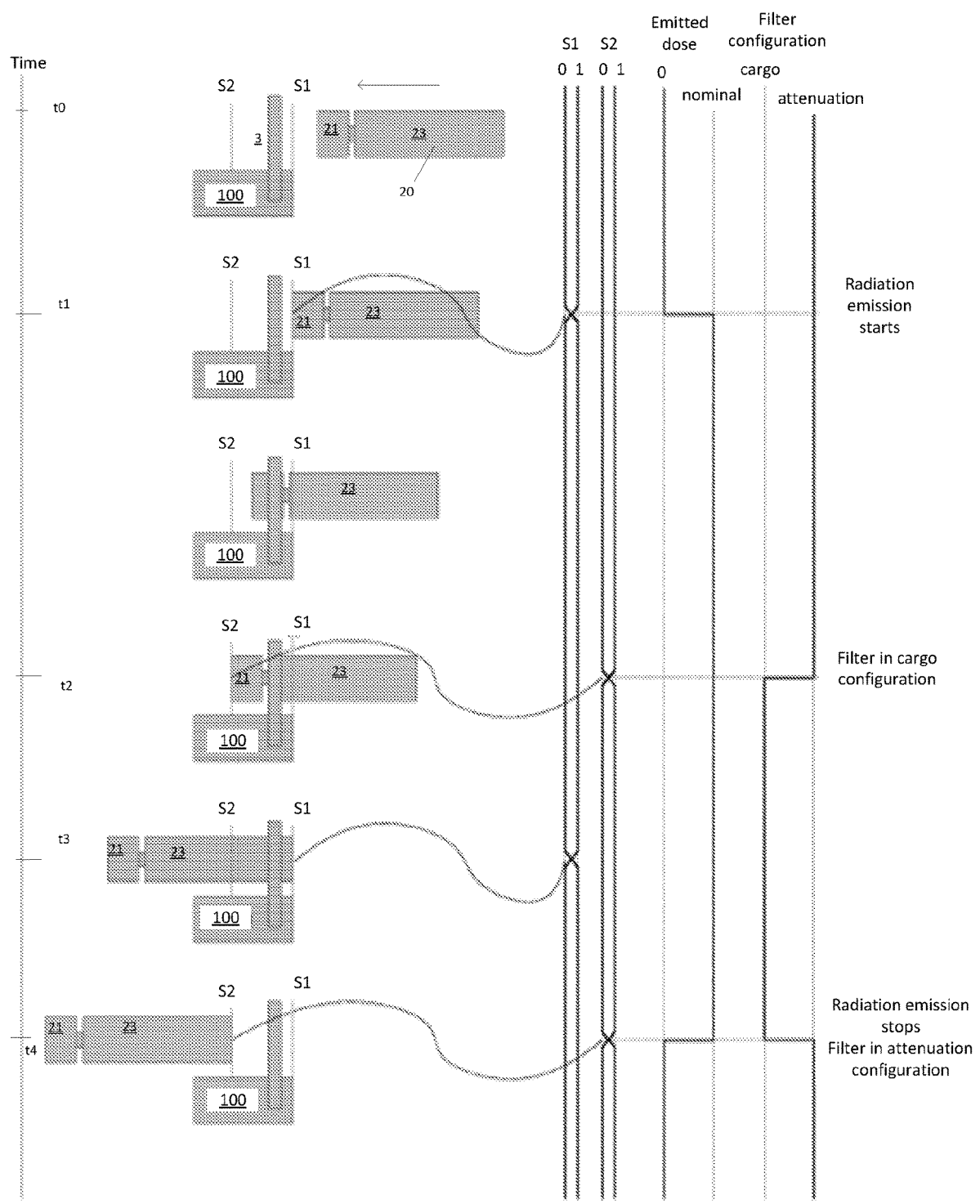
Figure 8B:
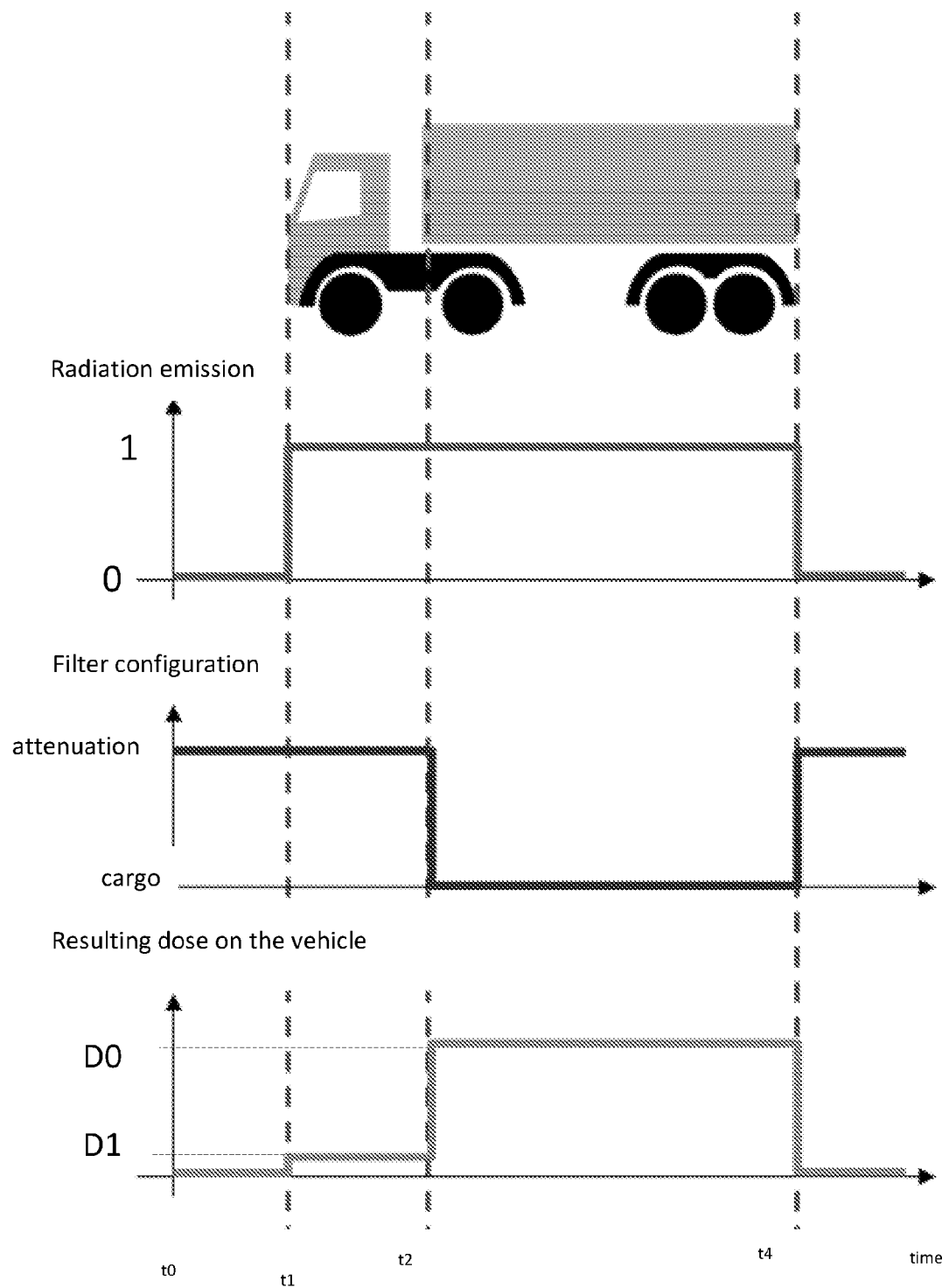
Figure 9A:
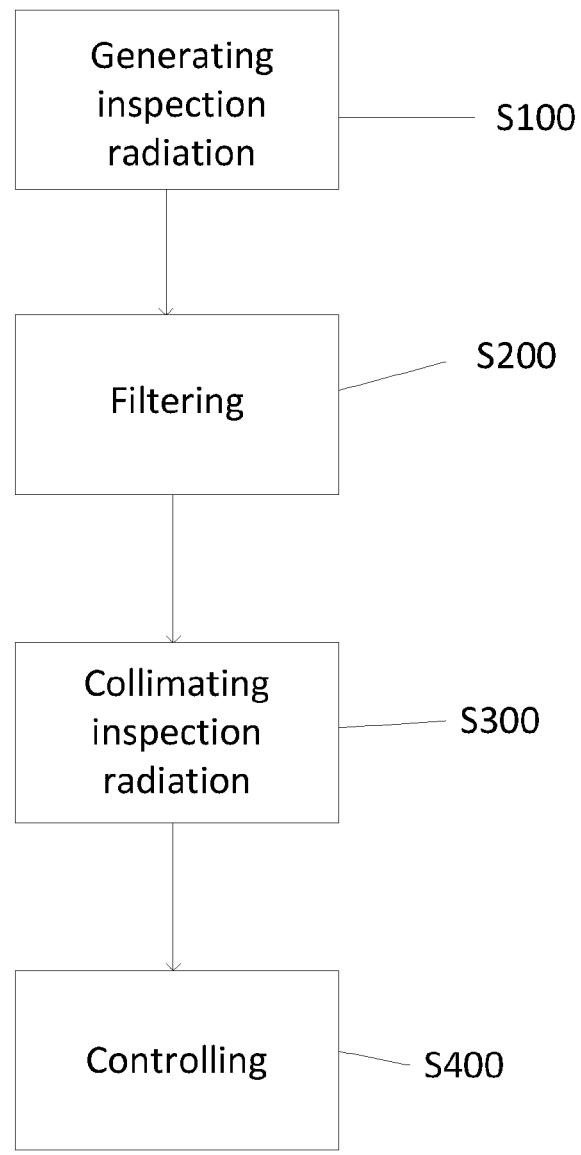
Figure 9B:
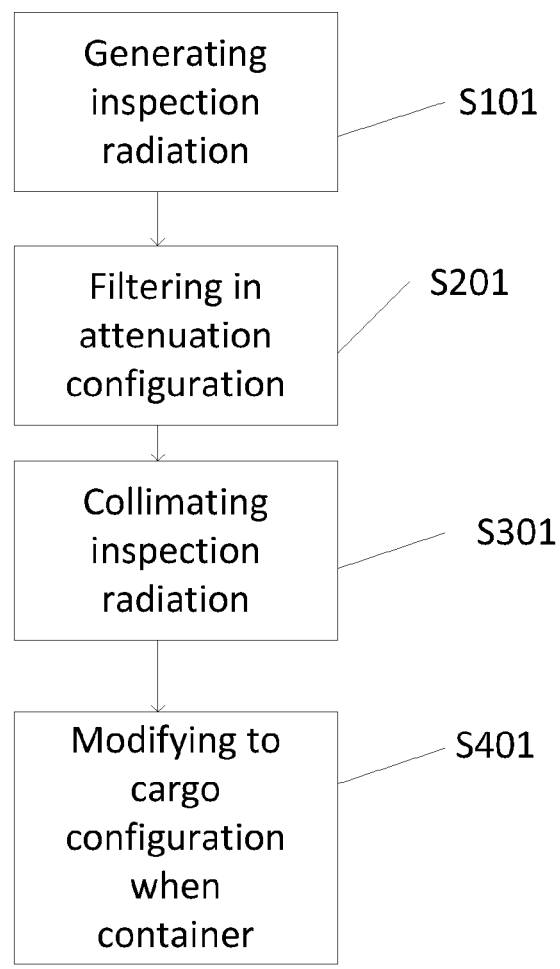

FIG. 6A is a graph showing an example of a squared Signal-to-Noise Ratio ($SNR^2$) associated with detectors as a function of an angle $\theta$ from which the detectors are seen by a source, as well as an example approximation LM of the squared Signal-to-Noise Ratio ($SNR^2$), the approximation being an example attenuating profile LM of an example filter, in a plane defined by a propagation of inspection radiation when the filter in the attenuation configuration;

FIG. 6B shows an example of an attenuating profile of an example filter, in a plane perpendicular to a plane defined by the propagation of the inspection radiation when the filter in the attenuation configuration, having a transmission window associated with reduced filtering of the inspection radiation;

FIG. 7A shows an example filter comprising different thicknesses of material, an attenuating profile of FIG. 6A and a recess associated with the transmission window of FIG. 6B;

FIG. 7B shows an example filter comprising a constant attenuating thickness but different attenuating materials, FIG. 8A shows examples of different relative positions of a vehicle and an inspection system, as well as filter configurations and doses emitted by the source, during an inspection;

FIG. 8B shows examples of variations of radiation emission, filter configuration and resulting dose on the vehicle, during the inspection of FIG. 8A; and FIGS. 9A and 9B are flowcharts that illustrate example methods for inspecting a vehicle.

In the drawings, like elements are referred to by the same numerical references.

DESCRIPTION OF EXAMPLE EMBODIMENTS

Overview

Figure 1:
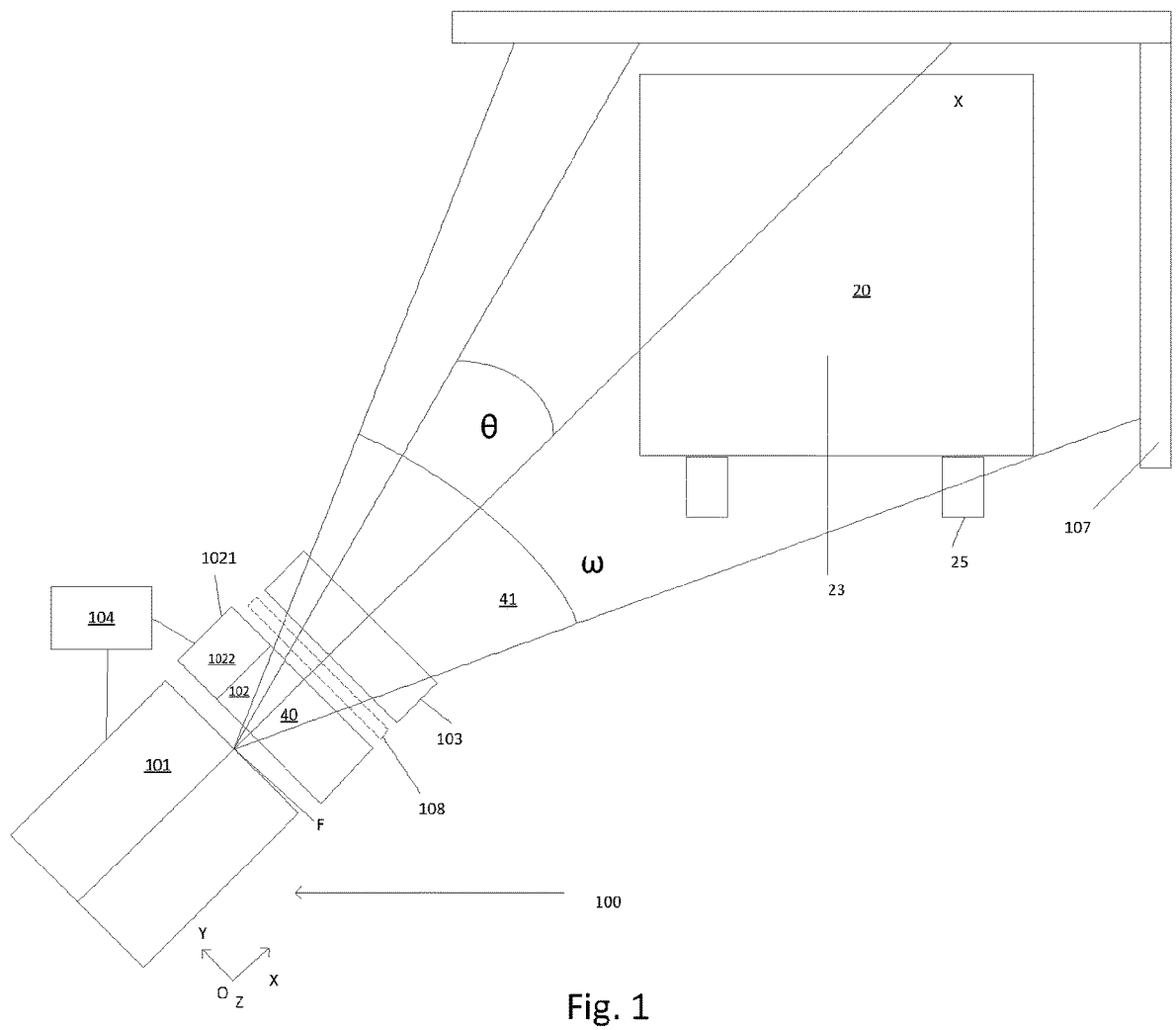
FIG. 1 shows an example inspection system, in a rear view.

FIG. 1 shows an example inspection system 100, in a rear view. The system 100 may be described with reference to an orthonormal reference OXYZ, axis OY being the ascending vertical relative to the system 100, a median plane XOY being vertical, a plane XOZ being horizontal relative to the system 100, and a plane YOZ being vertical relative to the system 100.

Figure 2:
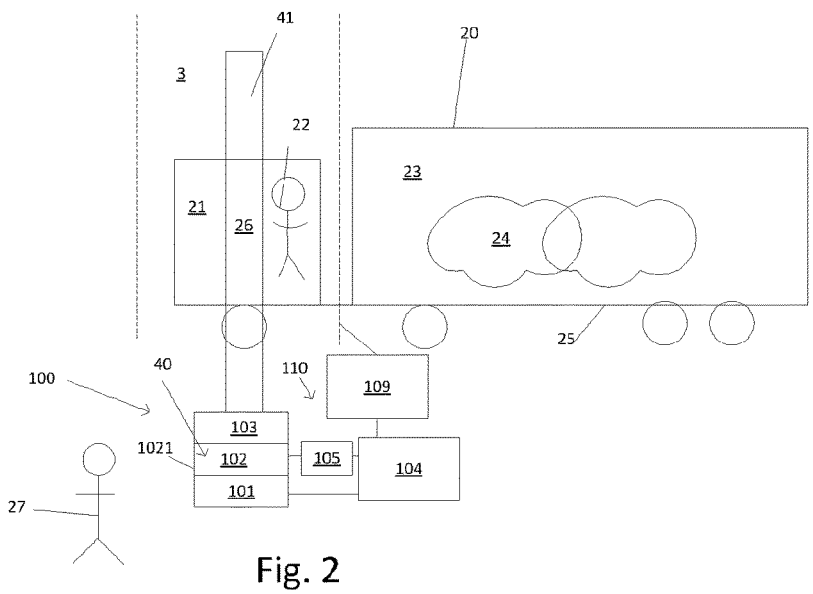
FIG. 2 shows the example inspection system of FIG. 1, in a side view.

The inspection system 100 of FIG. 1 is configured to inspect a vehicle 20, e.g. by transmission of inspection radiation 40 through the vehicle 20. As illustrated in FIG. 2, the inspection may take place when the vehicle 20 is located in a zone 3 of inspection.

As illustrated in FIG. 2, the vehicle 20 comprises a cabin 21, configured to be occupied by a user 22, and may comprise a container 23 configured to contain cargo 24. In some examples, the vehicle 20 may further comprise a trailer 25 configured to carry the container 23.

The system 100 of FIGS. 1 and 2 comprises a source 101 configured to generate the inspection radiation 40 having a radiation dose (e.g. associated with a radiation dose rate), and a collimator 103 configured to collimate the inspection radiation 40 into an inspection beam 41 configured to irradiate a section 26 of the vehicle 20. Quality of inspection images (e.g. contrast) is related to the dose deposited on detectors 107: the quality of the inspection images increases as the dose deposited on the detectors 107 increases.

The inspection radiation 40 also has an energy E associated with a nominal energy output of the source 101, (e.g. corresponding to a nominal mode of operation of the source 101). The nominal energy output of the source 101 may be determined with settings and/or parameters of the source 101, e.g. predetermined during manufacture of the source 101. In some examples, the inspection radiation 40 has a spectrum of rays forming the inspection radiation and having energies which may be comprised, e.g. between 0 and E. Penetration capacity of the radiation 40 is related to the energy E of the radiation: the penetration capacity of the radiation 40 increases as the energy of the radiation 40 increases. In some non-limiting examples, the energy E may be for example 6 MeV.

The system 100 illustrated in FIGS. 1 and 2 comprises a filter 102 located between the source 101 and the collimator 103.

Alternatively or additionally, in some examples, the system 100 may optionally comprise a rotating filter 108, and the system 100 may be operated in an "interlaced" mode, alternating the energy of the radiation between at least two levels of energy (e.g. 6 MeV and 4 MeV). In such examples, the filter 102 may be located between the source 101 and the rotating filter 108.

In some examples, the filter 102 may be removed from the system 100 and/or maintained independently from both the source 101 and the collimator 103 (and/or the filter 108 when the filter 108 is present).

In some examples, the source 101 and the collimator 103 each comprise respective casings. In some examples, the filter 102 may comprise a casing 1021 which is distinct from the respective casings of the source 101 and the collimator 103. In some examples, the filter 102 may comprise dedicated elements in the casing 1021, such as shielding, distinct from the source 101 and/or the collimator 103. In such examples the dedicated elements in the casing 1021 may improve the protection of the user 22 of the vehicle 20 and/or of an operator 27 of the system 100.

The filter 102 illustrated in FIGS. 1 and 2 has a cargo configuration (FIG. 1) where the filter 102 is configured to interact with the inspection radiation 40 to provide a cargo inspection dose for inspection by irradiation of the container 23 by the inspection beam 41. When the filter 102 is in the cargo configuration, inspection of the container 23 and the cargo 24 may be enabled. In the cargo configuration of the filter 102, the user 22 is not exposed to the cargo inspection dose, but may only be exposed to scattered radiation with a much lower dose. In some examples, the cargo inspection dose may be comprised between 10 mGy/min at 1 m and 2000 mGy/min at 1 m, such as between 20 mGy/min and 600 mGy/min at 1 m. For a system providing an "interlaced" mode, the doses coming from the two modes must be taken into account to obtain the total dose of inspection.

The filter 102 illustrated in FIGS. 1 and 2 has an attenuation configuration (FIG. 2) where the filter 102 is configured to attenuate the radiation dose to a cabin inspection dose, reduced compared to the cargo inspection dose. However the cabin inspection dose still enables inspection by irradiation of the cabin 21 by the inspection beam 41, i.e. the inspection of the cabin 21 may be enabled. In the attenuation configuration, the filter 102 does not completely block the radiation, and the cabin inspection dose may be high enough to enable irradiation of the cabin 21 for inspection. In some examples, the cabin inspection dose may be comprised between 2 mGy/min at 1 m and 20 mGy/min at 1 m.

In some examples, when the filter 102 is in the attenuation configuration, an entire image of the vehicle 20, i.e. including the cabin 21 and the container 23 may be obtained during the inspection.

In some examples, the cabin inspection dose may be low enough and may enable irradiation of the cabin 21 whilst the cabin 21 is occupied by the user 22. In such examples, the cabin inspection dose may comply with regulations limiting the dose to which the user 22 of the vehicles 20 may be exposed during the inspection. When the filter 102 is in the attenuation configuration, the irradiation dose to which the user 22 is exposed is acceptable according to the regulations.

In some non-limiting examples, the cabin inspection dose may be below a value of 250 nSv (nanoSievert) per inspection.

In a pass-through mode of inspection, the user 22 of the vehicle 20 may not need to step down of the cabin 21 of the vehicle 20. In such examples and in a Bumper-to-Bumper (BtoB) pass-through mode where the vehicle is placed on a mobile platform, the system 100 may increase the overall vehicle flow rate of the inspection, as the mobile platform may not need to be stopped. In such examples and in a pass-through mode where the user drives the vehicle 20, the system 100 may increase the overall vehicle flow rate of the inspection, as the user 22 may drive the vehicle 20 during the inspection. In some non-limiting examples, scan speed range may be comprised between 3 km/h and 15 km/h, such as between 5 and 7 km/h.

In pass-through mode examples, the system 100 may increase the overall vehicle flow rate of the inspection up to between 100 and 200 vehicles per hour. In pass-through mode examples, the system 100 may be relatively less expensive compared to a mobile inspection system, as the system 100 may not require the ability to move with respect to the vehicles 20 to be inspected. In pass-through mode examples, the system 100 may enable inspection of the cabin 21 and may enable detection of hidden objects (such as weapons or dangerous material) in the cabin 21.

The system 100 illustrated in FIGS. 1 and 2 comprises a controller 104 configured to control the configuration of the filter 102, such that the filter 102 is in the cargo configuration (FIG. 1) when the inspection beam 41 irradiates the container 23, and the filter 102 is in the attenuation configuration (FIG. 2) when the inspection beam 41 irradiates the cabin 21. In such examples, the system 100 may improve the protection of the user 22 of the vehicle 20 and/or of the operator 27 of the system 100.

Alternatively or additionally, in some examples, in the attenuation configuration the filter 102 may be configured to attenuate the radiation dose to the cabin inspection dose (i.e. enabling inspection by irradiation of the cabin 21 of the vehicle 20 by the inspection beam 41) and the system 100 may further comprise an activator 110 configured to modify the configuration of the filter 102, from the attenuation configuration to the cargo configuration, when a container 23 of the vehicle 20 enters the zone 3 of inspection. The system 100 of FIG. 2 comprises a detector 109 configured to determine that the container 23 enters the zone of inspection.

In some examples, the system 100 may be configured to inspect the whole vehicle 20 with the filter 102 being in the attenuation configuration. It may be the case e.g. when the vehicle 20 does not comprise a container (such as when the vehicle is van and/or a car a coach and/or a bus and only comprise a cabin) and when e.g. the detector 109 does not determine that the container 23 enters the zone 3 of inspection.

DETAILED DESCRIPTION OF EXAMPLE EMBODIMENTS

Figure 3A:
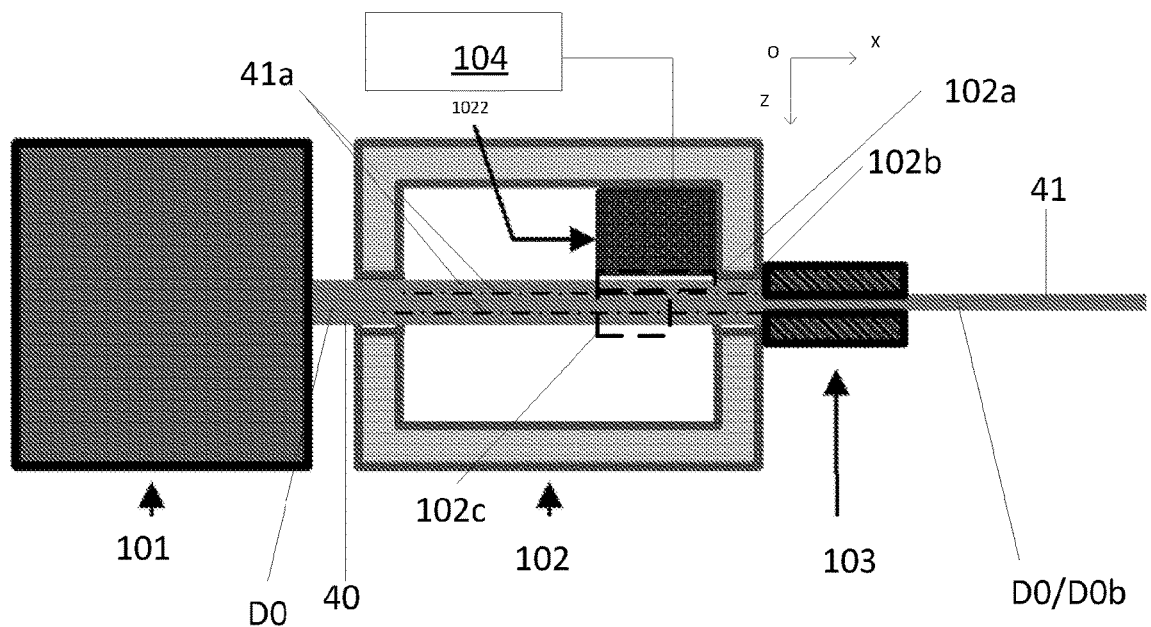
FIG. 3A shows an example of a detail of the inspection system of FIG. 1, in a top sectional view, comprising a filter being in a cargo configuration.

FIG. 3A shows an example of a detail of the inspection system 100 of FIG. 1, in a top sectional view. In FIG. 3A, the filter 102 is shown in the cargo configuration, and the filter 102 is configured to interact with the inspection radiation 40 to provide the cargo inspection dose, such as D0, for inspection by irradiation of the container 23 by the inspection beam 41. As described in more detail below, in some examples the filter 102 may be configured to interact with the inspection radiation by intersecting the inspection radiation or by not intersecting the inspection radiation.

In some examples, as illustrated in FIG. 3A, the filter 102 in the cargo configuration may intersect the inspection radiation 40 generated by the source 101 in a zone 102a (illustrated by a dotted line) not corresponding to the inspection beam 41 (illustrated by the mixed lines 41a). However, in such examples, the filter 102 in the cargo configuration does not intersect the inspection radiation 40 generated by the source 101 in a zone 102b corresponding to the inspection beam 41. In such examples, the cargo inspection dose D0 may be high enough (e.g. comprised between 10 mGy/min at 1 m and 2000 mGy/min at 1 m) and enables inspection by irradiation of the container 23 by the inspection beam 41.

In some examples, as illustrated in FIG. 3A, the filter 102 in the cargo configuration may intersect the inspection radiation 40 generated by the source 101 in the zone 102b (i.e. an attenuating material of the filter may be located e.g. in the zone 102b) corresponding to the inspection beam 41 (illustrated by the mixed lines 41a). In such examples, the filter 102 may be configured to provide a slightly reduced cargo inspection dose, such as D0b, for inspection by irradiation of the container 23 by the inspection beam 41. In some examples, the cargo inspection dose D0b may be reduced compared to the cargo inspection dose D0. However, in such examples, the cargo inspection dose D0b may be high enough and still enables inspection by irradiation of the container 23 by the inspection beam 41.

Figure 4A:
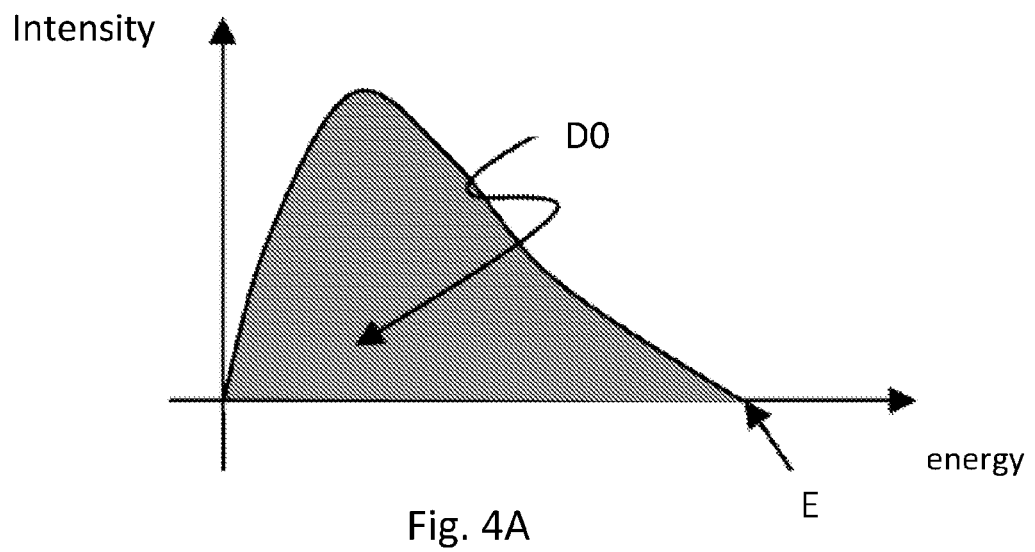
FIG. 4A shows an example of a spectrum of the inspection radiation, with the filter in the cargo configuration.

An example of a spectrum of the intensity of rays of the inspection radiation 40 as a function of the energies of the rays of the inspection radiation 40, when the filter 102 is in the cargo configuration is shown in FIG. 4A. On the spectrum of FIG. 4A, E corresponds to a nominal energy of the inspection radiation 40, E being associated with the nominal energy output of the source 101. It should be understood that in some examples the spectrum of FIG. 4A may be associated with the spectrum of the inspection beam 41, e.g. when the filter 102 does not intersect the inspection radiation 40 generated by the source 101 in the zone corresponding to the inspection beam 41. In the example of FIG. 4A, the radiation dose D0 may be associated with the area under the curve.

Figure 3B:
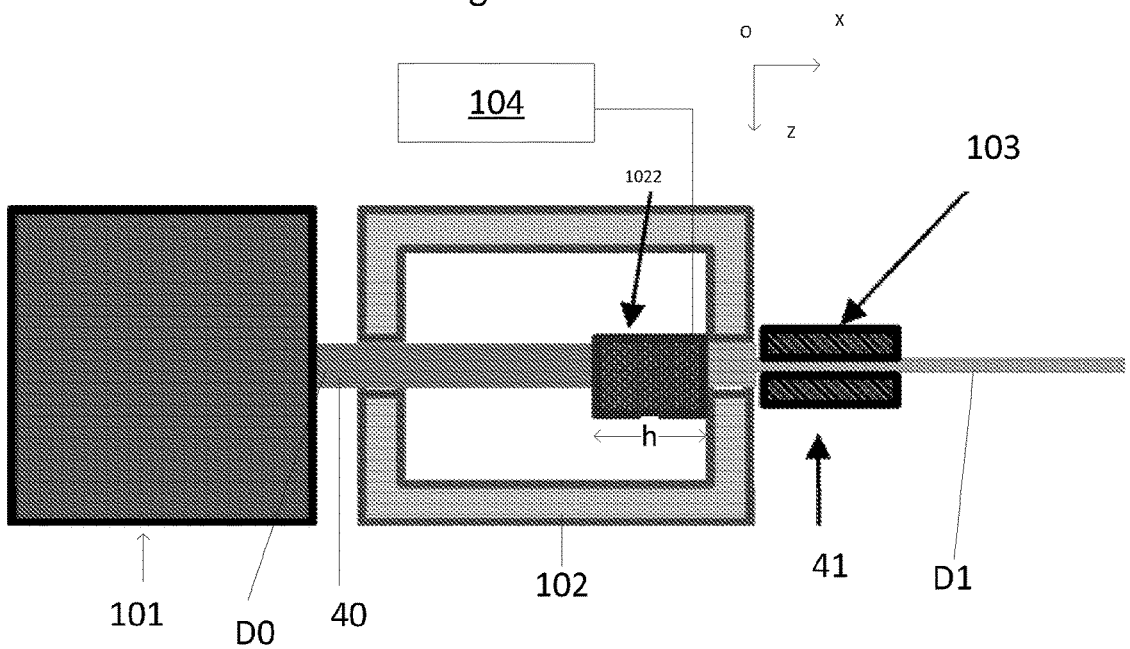
FIG. 3B shows an example of a detail of the inspection system of FIG. 1 comprising the filter, in a top sectional view, the filter being in an attenuation configuration.

In FIG. 3B the filter 102 is shown in the attenuation configuration. In the attenuation configuration, the filter 102 is configured to attenuate the radiation dose to the cabin inspection dose D1, reduced compared to the cargo inspection dose D0, yet enabling inspection by irradiation of the cabin 21 by the inspection beam 41.

Figure 4B:
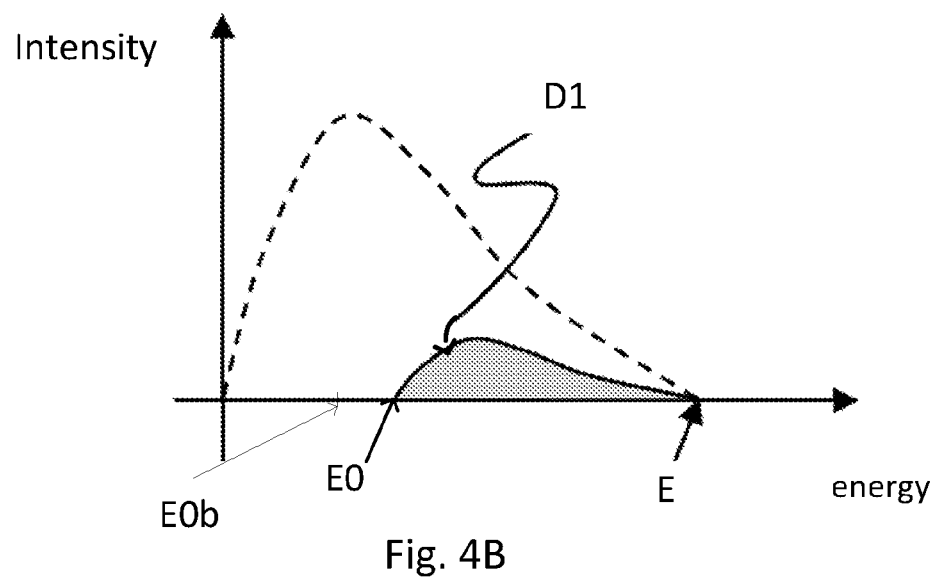
FIG. 4B shows an example of a spectrum of the inspection radiation, as filtered with the filter in the attenuation configuration.

FIG. 4B shows an example of the spectrum of the intensity of rays of the inspection radiation 40 as a function of the energies of the rays of the inspection radiation 40, when the inspection radiation 40 has been filtered by the filter 102 when the filter 102 is in the attenuation configuration. On the spectrum of FIG. 4B, the radiation dose D1 may be associated with the area under the curve. As illustrated in FIG. 4B, the filter 102 may be configured to attenuate the dose to the cabin inspection dose D1 by stopping or at least strongly attenuating the rays with low energies in the spectrum (e.g. by stopping or at least strongly attenuating the rays with the energies which are lower than e.g. energy E0 in FIG. 4B). The filtered radiation (i.e. with rays with energies comprised between E0 and E) is "hardened" compared with the non-filtered radiation with the spectrum of FIG. 4A comprising the rays with the lower energies, but has the reduced dose D1.

It should be understood that, in some examples, the cabin inspection dose D1 may be reduced by the filter 102 in the attenuation configuration because, in the attenuation configuration, the filter 102 modifies the spectrum of the inspection radiation 40, e.g. as shown by FIGS. 4A and 4B. In such examples, the filter 102 may not modify the nominal energy E of the inspection radiation, as shown by FIGS. 4A and 4B, because the nominal energy output of the source 101 may not be modified by the filter (e.g. the predetermined settings and/or parameters of the source 101 may not be modified by the filter).

In some examples, the cabin inspection dose D1 is reduced by a factor f (f=D0/D1) comprised between 2 and 100 compared to the cargo inspection dose D0, with f being typically:
  e.g. f=5 for a system 100 having a low cargo inspection dose (typically e.g. 40 mGy/min at 1 m),
  e.g. f=30 for a system 100 having a medium cargo inspection dose (typically e.g. 120 mGy/min at 1 m) and
  e.g. f=50 for a system 100 having a medium cargo inspection dose in an interlaced mode of operation (typically e.g. dual energy 150+80 mGy/min at 1 m).

In some examples, the cabin inspection dose D1 may be below a value of 250 nSv (nanoSievert) per inspection and enables irradiation of the cabin 21 whilst the cabin 21 is occupied by the user 22. It should be understood that the value of D1 may depend on the regulations from country to country. In some examples, the cabin inspection dose may be defined by ANSI 43.17-2009, the disclosure and teachings of which are hereby incorporated in their entirety by reference.

Figure 5:
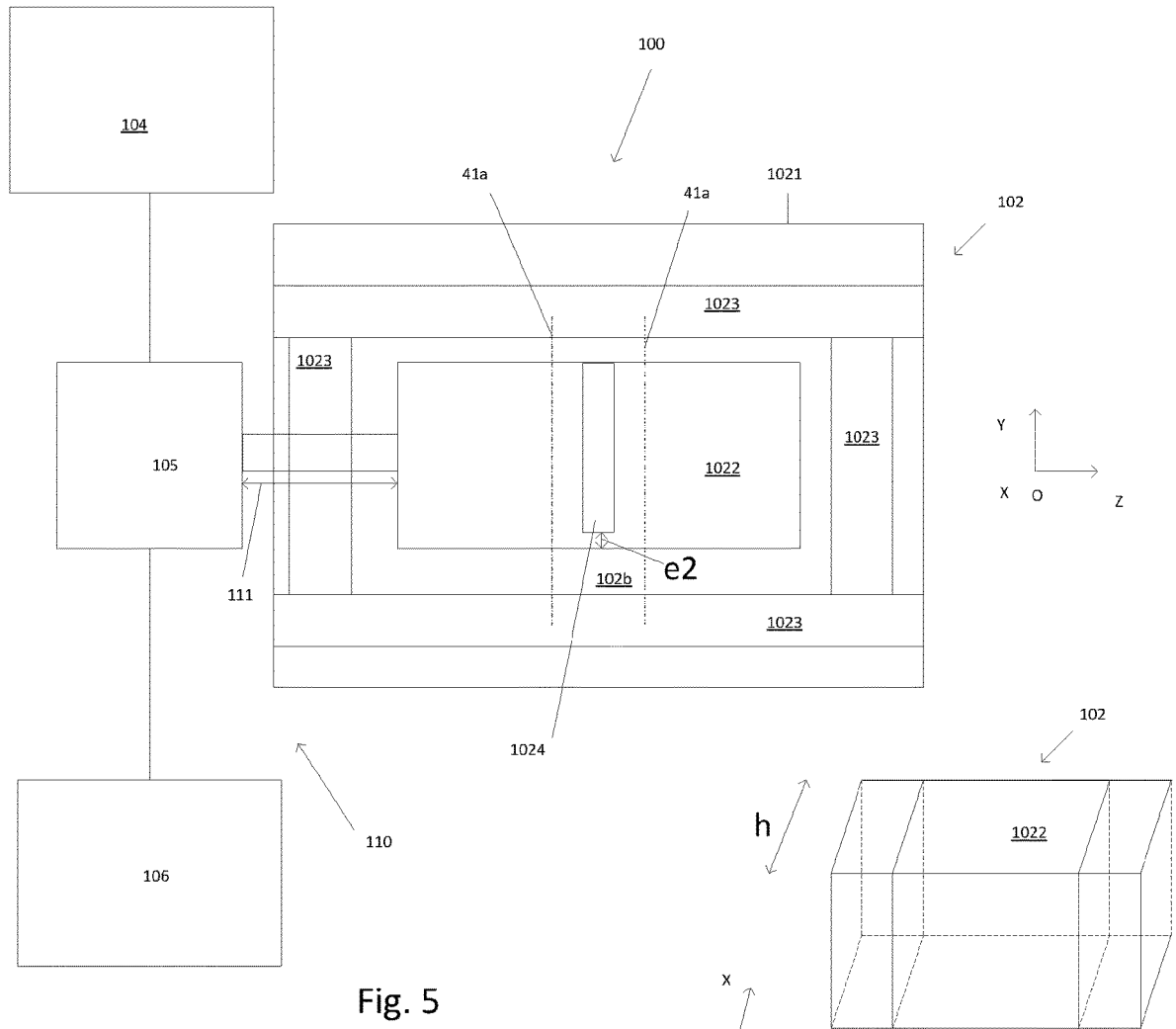
FIG. 5 shows an example of a detail of the inspection system of FIG. 1, in a side sectional view.

FIG. 5 shows an example of a detail of the inspection system 100 of FIG. 1, in a side sectional view. The system 100 illustrated in FIG. 5 comprises an actuator 105 configured to modify the configuration of the filter 102 between the attenuation configuration and the cargo configuration (e.g. by translation of the filter and/or rotation of the filter). In some examples, the actuator 105 may be configured to modify the configuration of the filter from the attenuation configuration to the cargo configuration when the container 23 enters the zone 3 of inspection (e.g. when the detector 109 detects the container 23 entering the zone 3 of inspection). The actuator 105 may comprise any type of actuator, such as comprising an electrical motor and/or a solenoid and/or hydraulic actuators (such as hydraulic cylinders).

The actuator 105 of the system 100 illustrated in FIG. 5 is also configured to receive at least a control signal from the controller 104 (e.g. to modify the configuration of the filter 102 between the attenuation configuration and the cargo configuration as described above) and/or power from a source 106 of power.

In some examples, the actuator 105 may be configured such that the filter 102 is in the attenuation configuration in absence of a control signal and/or power received by the actuator 105. In such examples, the system 100 may avoid irradiation of the user 22 and/or the operator 27 by the cargo inspection dose in case of a failure of the controller 104 and/or the source 106 of power. In some examples, the default configuration of the filter 102 may be the attenuation configuration. In some examples, the actuator 105 may comprise a bias 111, such as a spring, configured to maintain, by default (e.g. in absence of a control signal and/or power received by the actuator 105), the filter 102 in the attenuation configuration. In such examples, the actuator 105 is configured to act against the bias 111 in order to modify the filter configuration from the attenuation configuration to the cargo configuration.

The filter 102 of the inspection system 100 illustrated in FIG. 5 comprises an attenuating block 1022 and a shielding

1023. In some examples, the shielding 1023 may be configured to stop or at least attenuate radiation scattered by the attenuating block 1022. In some examples, the shielding 1023 may be dimensioned specifically for stopping or at least attenuating radiation scattered by the attenuating block 1022, i.e. independently from radiation scattered by other elements of the system 100, e.g. radiation scattered by the collimator 103 of the system 100. In such examples, the shielding 1023 may improve the protection of the user 22 of the vehicle 20 and/or of the operator 27 of the system 100.

In some examples, the shielding 1023 may be fixed with respect to the casing 1021 and does not overheat or overload the actuator 105.

The source 101 shown in FIG. 1 comprises:
- a device for producing and accelerating an electron beam, and
- a target (comprising a metal, such as tungsten and copper) for the electron beam, so as to generate the inspection radiation 40. The inspection radiation 40 has an angular divergence ω from a focal point F of the source 101 to the detectors 107.

Because of the nature of the source 101 and the way the radiation 40 is generated (the photons of the inspection radiation 40 are for example generated by the so-called braking radiation effect, also called "Bremsstrahlung"), the inspection dose has a maximum in a main axis FX of the radiation 40, and the inspection dose decreases as an angle θ (from which the detectors 107 are seen by the source 101, with respect to the main axis FX) increases. An example of an angular signature of the inspection radiation 40 generated by the source 101 is illustrated in FIG. 6A. The angular signature of the source 101 may be determined, either experimentally or through simulation calculations, and approximated e.g. by a Lorentz model or obtained by Monte Carlo methods. An example of determination of the Lorentz model is described in US 2014/341342, the disclosure and teachings of which are hereby incorporated in their entirety by reference. In FIG. 6A, the angular signature of the source 101 is approximated by a curve LM.

The attenuating block 1022 illustrated in FIG. 3B may comprise a single attenuating material (such as steel) and may have a single attenuating material thickness h. In such an example, the thickness h may be dimensioned for providing the attenuation dose enabling irradiation of the cabin 21 (e.g. D1=250 nSv, e.g. whilst the cabin 21 is occupied by the user 22) for θ=0 (i.e. on the main axis FX). In some examples, for a block 1022 comprising an attenuating material such as steel, the thickness h may be comprised between e.g. 5 and 20 cm, such as e.g. comprised between 10 and 15 cm. In such an example, the attenuation dose associated with larger values of θ (e.g. at the bottom and at the top of the cabin 21) may be well below 250 nSv, because (1) of the angular signature of the radiation (as explained above and as illustrated in FIG. 6A) and/or (2) because of the thickness of the attenuating material which increases as θ increases when the filter 102 is in the attenuation configuration. In such examples, the block 1022 having a single attenuating material and a single attenuating material thickness h may improve the protection of the user 22 of the vehicle 20 and/or of the operator 27 of the system 100, in particular at locations of the cabin 21 associated with greater values of θ (e.g. at the bottom and at the top of the cabin 21).

As described in greater detail below, the filter 102 may comprise a plurality of different attenuating materials and/or may have a plurality of different attenuating material thicknesses.

In some examples, the filter 102 may be configured to provide a dose deposited on the detectors 107 which is constant over the detectors 107. In such an example, the filter 102 may provide an image with a quality which is constant over the detectors 107, i.e. regardless of the angle θ. In such examples, the filter 102 may provide an image with a constant quality over the detectors 107, i.e. both on the main axis FX and at the bottom and at the top of the cabin 21 (i.e. at locations associated with greater values of θ). In such examples, the filter 102 may be configured to have an attenuating profile, in the median plane XOY (defined by a propagation of the inspection radiation 40 when the filter 102 is in the attenuation configuration), having an angular signature associated with the angular signature of the inspection radiation generated by the source 101 (and illustrated in FIG. 6A). In such examples, the filter 102 may have the attenuating profile corresponding to the approximation LM illustrated in FIG. 6A. The block 1022 illustrated in FIG. 7A has the attenuating profile LM, in the median plane XOY. In such an example, the block 1022 illustrated in FIG. 7A has a plurality of different attenuating material thicknesses to provide the attenuating profile LM. Alternatively or additionally, in some examples the block 1022 may comprise a plurality of different attenuating materials (such as steel and lead) to provide the attenuating profile LM illustrated in FIG. 6A. In such examples, the more dense material (such as lead) may be a part of the filter 102 corresponding to the main axis FX of the radiation 41 when the filter 102 is in the attenuation configuration, and the less dense material (such as steel) may be a part of the filter 102 associated with greater values of θ when the filter 102 is in the attenuation configuration.

In some examples and as illustrated in FIG. 6B, the filter 102 may be configured to have an attenuating profile (e.g. in the plane YOZ perpendicular to the median plane XOY defined by the propagation of the inspection radiation 40 when the filter 102 is in the attenuation configuration) having a transmission window T associated with reduced filtering of the inspection radiation (the transmission may be defined as an inverse of the attenuation). In such examples, the transmission window T may be associated with a less-filtered radiation (i.e. comprising rays with energies below E0 as illustrated in FIG. 4B, e.g. comprising rays with energies between E0b and E), i.e. a radiation which is less hardened compared with the filtered radiation comprising rays with energies only above E0 in FIG. 4B. In such examples, the collimated less-filtered (i.e. less hardened) beam 41 may better interact with thin sheets of material (which usually compose the cabin 21) thanks to the rays with lower energies, and may provide better contrast on the inspection images of the cabin 21. In such examples, the collimated less-filtered (i.e. less hardened) beam 41 may enable more accurate inspection images (thanks to the rays with lower energies), compared with a collimated more hardened beam (e.g. obtained without the transmission window T) which may enable more penetrative inspection images (thanks to the rays with higher energies).

In such examples, the filter 102 may be configured such that the cabin inspection dose may not be increased compared with a cabin inspection dose provided by the filter not having the transmission window T. In such examples and as illustrated in FIGS. 3A and 5, the transmission window T has a width smaller than a width of the zone 102b of the inspection beam 41 (illustrated by the mixed lines 41a in FIGS. 3A and 5). In such examples, for a width of the zone 102b being e.g. 5 mm, the width of the transmission window T may be e.g. 1 mm. In such examples, the smaller width of the transmission window T enables maintaining the cabin inspection dose to substantially the same level compared with a cabin inspection dose provided by the filter not having the transmission window T. The filter 102 having a transmission window T may enable a dose level enabling irradiation of the cabin (e.g. whilst the cabin 21 is occupied by the user 22), yet enabling better contrast on the inspection images of the cabin 21 compared with inspection images obtained with a filter 102 not associated with the transmission window T.

As shown in FIGS. 5 and 7A, in such examples, the filter 102 may comprise a recess 1024 provided in the median plane XOY (defined by the propagation of the inspection radiation 40 when the filter 102 is in the attenuation configuration). In such examples, the recess 1024 may be associated with the transmission window T of the reduced filtering of the inspection radiation. The recess 1024 of FIG. 7A comprises a blind recess 1024, which may be provided on the block 1022. In such an example, the radiation 40 may be filtered on a reduced thickness e1 of material of the block 1022 at the level of the recess 1024. In some examples, for a block 1022 comprising an attenuating material such as steel with a thickness h comprised between e.g. 12 and 15 cm, the depth of the recess 1024 may for example be comprised between 10 and 12 cm, and the thickness e1 may be comprised between e.g. 1 and 5 cm, such as e1 may be equal to e.g. 2 cm. In some examples, the recess 1024 may be a recess which is open through the whole of the block 1022 (i.e. e1=0). In such an example, the width of the recess 1024 may be further reduced to maintain the cabin inspection dose to substantially the same level compared with the cabin inspection dose obtained with e1 being different from zero (i.e. e1≠0).

As described below, in some examples the transmission window T may have a dimension associated with a predetermined region of the cabin, in the plane XOY defined by the propagation of the inspection radiation.

The recess 1024 of FIG. 7A does not extend over the whole of a height of the block 1022 in the OY direction. The block shown in FIG. 7A comprises at least a dimension e2 not associated with the recess 1024 in the OY direction. In some examples, the location of the recess 1024 on the height of the block 1022 in the OY direction may be selected such that the recess 1024 may be associated with a region of the cabin 21 where a more accurate and less penetrative zone of the inspection image may be required. In some examples, the more accurate and less penetrative zone of the inspection image may be required where materials of the cabin 21 may not require high penetration of the radiation. In some examples the more accurate and less penetrative zone may comprise e.g. the top of the cabin 21, where the materials comprise mainly thin sheets of steels (e.g. doors), glass (windows and windscreen), fabric (e.g. seats), etc.

In such examples, the dimension e2 may be associated with a region of the cabin 21 where a less accurate but more penetrative zone of the inspection image may be required. In some examples, the less accurate and more penetrative zone of the inspection image may be required where materials of the cabin 21 may require high penetration of the radiation. In some examples, the less accurate and more penetrative zone of the inspection image may comprise e.g. the engine of the vehicle 20, usually located at the bottom of the cabin 21 for e.g. trucks, and which is mainly made of a large amount of steel. In some examples, the dimension e2 may be selected to correspond to the region of the cabin and to the less accurate and more penetrative zone of the inspection image. In such examples the dimension e2 may be selected to correspond to a region of the cabin below a height e.g. of 2 m (e.g. for the engine). Other dimensions are envisaged.

In some examples, the recess 1024 could extend over the whole of the height of the block 1022 in the OY direction (i.e. e2=0).

The block 1022 illustrated in FIG. 7A is provided with the recess 1024 associated with the transmission window T, in the median plane XOY when the filter 102 is in the attenuation configuration. Alternatively or additionally, in some examples the block 1022 may comprise a plurality of different attenuating materials (such as steel and lead) to provide the transmission window T illustrated in FIG. 6B. In such examples, the more dense material (such as lead) may be a part of the filter 102 corresponding to the dimension e2, and the less dense material (such as steel) may be a part of the filter 102 associated with the transmission window T.

The filter 102 illustrated in FIG. 7A is configured to attenuate less and less the radiation dose, progressively as the configuration of the filter 102 is modified from the attenuation configuration to the cargo configuration. The filter 102 illustrated in FIG. 7A has a plurality of different attenuating material thicknesses in the OZ direction. Alternatively or additionally, as illustrated in FIG. 7B, the filter 102 may comprise a plurality of different attenuating materials to attenuate less and less the radiation dose, progressively as the configuration of the filter is modified from the attenuation configuration to the cargo configuration.

In such examples, the filter 102 may have more than two configurations (corresponding respectively to the cargo configuration or the attenuation configuration). In such an example, the filter 102 may provide a progressive transition of attenuation as the configuration of the filter 102 is modified from the attenuation configuration to the cargo configuration. In such an example, the filter 102 may enable easier inspection image correction as the configuration of the filter 102 is modified from the attenuation configuration to the cargo configuration.

It should be understood that the user 22 of the vehicle 20 may be exposed to radiation scattered by the cargo 24 and/or the container 23 during the inspection of the container 23. It should be understood that the scattered radiation is more important during the first moments of the inspection of the container 23, because, during the first moments of the inspection of the container 23, the inspection beam 41 is close to the user 22. In some examples, a progressive transition from the attenuation configuration to the cargo configuration (i.e. with a part of the filter 102 still attenuating the radiation beam at the start of the cargo configuration) may enable reducing the dose to which the user 22 is exposed.

It should also be understood that a radiation safety area of the inspection system depends on radiation scattered by the cargo 24 and/or the container 23 during the inspection of the container 23. In some examples, a selection of a configuration of the filter among a plurality of configurations (comprising more than two configurations) may enable a selection of the radiation safety area of the inspection system. In such examples, the selection of the configuration of the filter may comprise selecting a position of the filter with respect to the inspection radiation, e.g. by selecting the position of the filter on the OZ axis, based on the material and/or the thickness of the attenuating block 1022. In such examples, in e.g. a "Standard" mode, the cabin 21 of the vehicle 20 may be scanned with an attenuation configuration corresponding to 6 cm of steel, and the container 23 may be scanned with a first cargo configuration corresponding to 0 cm of steel (i.e. in the first cargo configuration the filter does not intersect the inspection radiation in the zone corresponding to the inspection beam). In the Standard mode, the radiation safety area may be e.g. 40×40 m². In such an example, in a e.g. "Reduced Area" mode, the cabin 21 of the vehicle 20 may be scanned with an attenuation configuration corresponding to 6 cm of steel, and the container 23 may be scanned with a second cargo configuration corresponding to 3 cm of steel (i.e. in the second cargo configuration the filter intersects the inspection radiation in the zone corresponding to the inspection beam). In the Reduced Area mode, the radiation safety area may be reduced, e.g. to 25×25 m².

In some examples, the filter may modify attenuation abruptly as the configuration of the filter 102 is modified from the attenuation configuration to the cargo configuration. In such an example, the filter may be configured to provide the cabin inspection dose D1 and the cargo inspection dose D0, abruptly after, as the configuration of the filter 102 is modified from the attenuation configuration to the cargo configuration. In such examples, the quality of the inspection images of the container 23 may be improved.

It should be understood that, even in cases where it is not explicitly mentioned in the present disclosure, a transmission window T may be provided in any one of the examples described above, e.g. in a filter which could be operated in a Standard mode and/or Reduced Area mode. More generally, in the context of the present disclosure, any aspect of any one of the examples may be used in combination with one or more of any aspect of another example.

The collimator 103 is configured to collimate the inspection radiation 40 into the inspection beam 41 configured to irradiate the section 26 of the vehicle 20. In some examples, the inspection system 100 and the vehicle 20 are configured to move relative to one another during the inspection, to perform a scan of the vehicle 20. In some examples, the system may comprise a mobile platform.

In some examples, the controller 104 may be configured to modify the configuration of the filter 102 from the attenuation configuration to the cargo configuration based on a determination that the container 23 of the vehicle 20 enters in the zone 3 of inspection. In some examples, the activator 110 may be configured to modify the configuration of the filter, from the attenuation configuration to the cargo configuration, when the container 23 enters the zone 3 of inspection.

In some examples, the detector 109 may be connected to the controller 104 and/or the activator 110 and may enable:
the controller 104 to control the configuration of the filter 102, and/or
the controller 104 and/or the activator 110 to determine that the container 23 enters in the zone 3 of inspection.
As non-limiting examples, the detector 109 may comprise at least one of:
optical sensors (such as comprising lasers and/or optical cameras), and/or
mechanical sensors (such as a mechanical switch), and/or
sensors configured to sense radio waves (such as radars).
In some examples, the controller 104 may be configured to control the configuration of the filter 102 based on at least one of:
a detection of the cabin 21 and/or the container 23 in the zone 3 of inspection; and/or
a time elapsed since a time of the detection of the cabin 21 and/or the container 23 in the zone 3 of inspection; and/or
a distance covered by the vehicle 20 since the detection of the cabin 21 and/or the container 23 in the zone 3 of inspection; and/or
a geometrical profile of the vehicle 20.

Alternatively or additionally, the controller 104 and/or the detector 9 may be configured to determine that the container 23 enters in the zone 3 of inspection based on at least one of:
a detection of the cabin 21 and/or the container 23 in the zone 3 of inspection; and/or
a time elapsed since a time of the detection of the cabin 21 and/or the container 23 in the zone 3 of inspection; and/or
a distance covered by the vehicle 20 since the detection of the cabin 21 and/or the container 23 in the zone 3 of inspection; and/or
a geometrical profile of the vehicle 20.

As non-limiting examples, the controller 104 may comprise a memory and a processor and may be configured to perform calculations based on e.g. a signal received by the detector 109 and/or information associated with time and/or distance and/or speed. In some examples the information may be received from a component external to the controller 104 (such as the detector 109) and or may be provided internally to the controller 104 (such as by a clock).

In some examples, the detector 109 may form at least a part of the activator 110 or the actuator 105. In some examples, the actuator 105 may form at least a part of the activator 110.

In some examples, the system 100 may be configured to detect when the cabin 21 enters the zone 3 of inspection (e.g. when the windscreen enters the zone 3 of inspection, e.g. using optical sensors), and to measure the speed of the vehicle in the zone 3 (e.g. using a speed radar). The controller 104 may be configured to modify the configuration of the filter 102 based on the geometrical profile of the vehicle 20 (such as it may be assumed and/or determined that the cabin 21 has a length e.g. of 2.5 m) and on the above detection and measure. As described below, other examples are envisaged.

FIG. 8A shows examples of different relative positions of the vehicle 20 and the inspection system 100, during an inspection.

The inspection starts at t0, where the vehicle 20 moves relative to the system 100 during the inspection. It should be understood that the vehicle 20 moves during the whole of the inspection, in order to perform the scan (e.g. the vehicle 20 is driven by the user or moved on a mobile platform). As shown in FIG. 8B, the source 101 does not emit radiation, and the filter 102 is in the attenuation configuration (e.g. default configuration).

At t1, it is detected that the cabin 21 enters in the zone 3 of inspection, at S1 (e.g. optical sensors may be located at S1). The source 101 starts to emit the radiation. As shown in FIG. 8B, the filter 102 is in the attenuation configuration and inspection of the cabin 21 is enabled.

At t2, it is detected that the cabin 21 exits the zone 3 of inspection, at S2 (e.g. optical sensors may be located at S2). It is thus determined that cargo inspection may be allowed. As shown in FIG. 8B, the source 101 continues to emit the radiation, but the configuration of the filter 102 is modified, and the filter 102 is in the cargo configuration. Inspection of the cargo is enabled.

At t3, it is detected that an end of the container 23 enters the zone 3 of inspection, at S1. This enables determination of the size of the container 23. The source 101 continues to emit the radiation, and the filter 102 is still in the cargo configuration.

At t4, it is detected that the container 23 exits the zone 3 of inspection, at S2. The source 101 stops emitting the inspection radiation, and the configuration of the filter 102 is modified, and the filter 102 is in the attenuation configuration, as also shown in FIG. 8B.

FIG. 9A is a flowchart that illustrates an example method for inspecting the vehicle. In some examples the method may comprise:

- generating at S100 the inspection radiation having the radiation dose; and
- collimating at S300 the inspection radiation into the inspection beam configured to irradiate the section of the vehicle.

In some examples, the method further comprises:

- filtering, at S200, the inspection radiation between the generating and the collimating, and
- controlling, at S400, the configuration of the filtering, such that the filtering is in the cargo configuration when the inspection beam irradiates the container, and in the attenuation configuration when the inspection beam irradiates the cabin.

FIG. 9B is a flowchart that illustrates an example method for inspecting the vehicle. In some examples the method may comprise:

- generating, at S101, the inspection radiation having the radiation dose;
- collimating, at S301, the inspection radiation into the inspection beam configured to irradiate the section of the vehicle in the zone of inspection;
- filtering, at S201, the inspection radiation, between the generating and the collimating, in the attenuation configuration to attenuate the radiation dose to the cabin inspection dose enabling inspection by irradiation of the cabin of the vehicle by the inspection beam, the cabin being configured to be occupied by a user; and
- modifying, at S401 the filtering, from the attenuation configuration to the cargo configuration when a container of the vehicle enters the zone of inspection, the container being configured to contain cargo, to provide the cargo inspection dose greater than the cabin inspection dose, for inspection by irradiation of the container by the inspection beam.

MODIFICATIONS AND VARIATIONS

The radiation source 101 is configured to cause the inspection of the cargo 24 through the material (usually steel) of walls of the container 23, e.g. for detection and/or identification of the cargo 24. Alternatively or additionally, the inspection radiation 40 may be transmitted through the vehicle 20 (the material of the vehicle 20 being thus transparent to the radiation), while the radiation may, at least partly, be reflected by the vehicle 20 (called "back scatter"). In such examples, the material and/or composition of the vehicle 20 located being thus only partly transparent to the radiation, and partly reflective to the radiation—in that case, detectors may be placed to receive the radiation reflected by the vehicle 20.

In some examples, the inspection system 100 may be mobile and may be transported from a location to another location (the system 100 may comprise an automotive vehicle).

The electrons are generally accelerated under a voltage comprised between 100 keV and 15 MeV. In mobile inspection systems, the power of the X-ray source 101 may be e.g., between 100 keV and 9.0 MeV, typically e.g., 300 keV, 2 MeV, 3.5 MeV, 4 MeV, or 6 MeV, for a steel penetration capacity e.g., between 40 mm to 400 mm, typically e.g., 300 mm (12 in).

In static inspection systems, the power of the X-ray source 101 may be e.g., between 1 MeV and 10 MeV, typically e.g., 9 MeV, for a steel penetration capacity e.g., between 300 mm to 450 mm, typically e.g., 410 mm (16.1 in).

In some examples, the source 101 may emit successive x-ray pulses. The pulses may be emitted at a given frequency, comprised between 50 Hz and 1000 Hz, for example approximately 200 Hz.

According to some examples, the detectors 107 may be mounted on a gantry, as shown in FIG. 1. The gantry for example forms an inverted "L" extending in the median plane XOY. In mobile inspection systems, the gantry may comprise an electro-hydraulic boom which can operate in a retracted position in a transport mode (not shown on the Figures) and in an inspection position (FIG. 1). The boom may be operated by hydraulic actuators (such as hydraulic cylinders). In static inspection systems, the gantry may comprise a static structure.

It should be understood that the inspection radiation source may comprise sources of other radiation, such as, as non-limiting examples, sources of ionizing radiation, for example gamma rays or neutrons. The inspection radiation source may also comprise sources which are not adapted to be activated by a power supply, such as radioactive sources, such as using Co60 or Cs137. In some examples, the inspection system may comprise other types of detectors, such as optional gamma and/or neutrons detectors, e.g., adapted to detect the presence of radioactive gamma and/or neutrons emitting materials within the load, e.g., simultaneously to the X-ray inspection.

In the context of the present disclosure, the vehicle 20 may be any type of vehicle, such as a truck, a van and/or a car and/or a train and/or a coach and/or a bus. In examples where the vehicle 20 may be a coach, the whole vehicle 20 may be scanned with the filter in the attenuation configuration.

In the context of the present disclosure, the container 23 may be any type of container, such as a holder or a box, etc. The container 23 may thus be, as non-limiting examples a palette (for example a palette of European standard, of US standard or of any other standard) and/or a train wagon and/or a tank and/or a boot of the vehicle and/or a "shipping container" (such as a tank or an ISO container or a non-ISO container or a Unit Load Device (ULD) container).

In some examples, one or more memory elements (e.g., the memory of the controller or a memory element of the processor) can store data used for the operations described herein. This includes the memory element being able to store software, logic, code, or processor instructions that are executed to carry out the activities described in the disclosure.

A processor can execute any type of instructions associated with the data to achieve the operations detailed herein in the disclosure. In one example, the processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

As one possibility, there is provided a computer program, computer program product, or computer readable medium, comprising computer program instructions to cause a programmable computer to carry out any one or more of the methods described herein. In example implementations, at least some portions of the activities related to the controller and/or the activator and/or the actuator and/or the detector may be implemented in software. It is appreciated that software components of the present disclosure may, if desired, be implemented in ROM (read only memory) form. The software components may, generally, be implemented in hardware, if desired, using conventional techniques.

Other variations and modifications of the system will be apparent to the skilled in the art in the context of the present disclosure, and various features described above may have advantages with or without other features described above. The above embodiments are to be understood as illustrative examples, and further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. An inspection system comprising:
a source configured to generate inspection radiation having a radiation dose;
a collimator configured to collimate the inspection radiation into an inspection beam configured to irradiate a section of a vehicle;
a filter located between the source and the collimator, the filter enclosed separately from the collimator, the filter having at least:
 a cargo configuration where the filter is configured to interact with the inspection radiation to provide a cargo inspection dose for inspection by irradiation of a container of the vehicle by the inspection beam, the container being configured to contain cargo, and
 an attenuation configuration where the filter is configured to attenuate the radiation dose to a cabin inspection dose reduced compared to the cargo inspection dose yet enabling inspection by irradiation of a cabin of the vehicle by the inspection beam, the cabin being configured to be occupied by a user; and
a controller configured to control the configuration of the filter, such that the filter is:
 in the cargo configuration when the inspection beam irradiates the container, and
 in the attenuation configuration when the inspection beam irradiates the cabin.

2. The inspection system of claim 1, wherein, in the cargo configuration, the filter does not intersect the inspection radiation generated by the source in a zone corresponding to the inspection beam.

3. The inspection system of claim 1, further comprising: an actuator configured to:
receive at least a control signal from the controller and/or power from a source of power, and
modify the configuration of the filter from the attenuation configuration to the cargo configuration when the container enters a zone of inspection, and
wherein the filter is in the attenuation configuration in absence of a control signal and/or power received by the actuator.

4. The inspection system of claim 1, wherein the source and the collimator comprise respective casings, and wherein the filter comprises a casing which is distinct from the respective casings of the source and the collimator.

5. The inspection system of claim 1, wherein the filter is configured to have an attenuating profile, in a plane defined by a propagation of the inspection radiation, having an angular signature associated with an angular signature of the inspection radiation generated by the source.

6. The inspection system of claim 1, wherein the filter is configured to have an attenuating profile, in a plane perpendicular to a plane defined by a propagation of the inspection radiation, having a transmission window associated with reduced filtering of the inspection radiation.

7. The inspection system of claim 1, wherein the filter is configured to attenuate less and less of the radiation dose as the configuration of the filter is modified from the attenuation configuration to the cargo configuration.

8. An inspection system comprising:
a source configured to generate inspection radiation having a radiation dose;
a collimator configured to collimate the inspection radiation into an inspection beam configured to irradiate a section of a vehicle in a zone of inspection;
a filter located between the source and the collimator, the filter enclosed separately from the collimator, the filter having at least an attenuation configuration where the filter is configured to attenuate the radiation dose to a cabin inspection dose enabling inspection by irradiation of a cabin of the vehicle by the inspection beam, the cabin being configured to be occupied by a user; and
an activator configured to modify the configuration of the filter, from the attenuation configuration to a cargo configuration, when a container of the vehicle enters the zone of inspection, wherein the container is configured to contain cargo and wherein, in the cargo configuration, the filter is configured to interact with the inspection radiation to provide a cargo inspection dose greater than the cabin inspection dose for inspection by irradiation of the container by the inspection beam.

9. The inspection system of claim 1, wherein the cabin inspection dose enables irradiation of the cabin whilst the cabin is occupied by the user.

10. The inspection system of claim 1, wherein the cabin inspection dose is reduced by a factor comprised between 2 and 100 compared to the cargo inspection dose.

11. The inspection system of claim 1, wherein the cabin inspection dose is below a value of 250 nSv per inspection.

12. The inspection system of claim 1, wherein the vehicle further comprises a trailer configured to carry the container.

13. The inspection system of claim 1, configured to inspect the vehicle by transmission of radiation through the vehicle.

14. A method for inspecting a vehicle located in a zone of inspection by using inspection radiation, comprising:
generating inspection radiation having a radiation dose; and collimating the inspection radiation into an inspection beam configured to irradiate a section of the vehicle, the collimating performed by a collimator;

wherein the method further comprises:

filtering the inspection radiation between at least two configurations, between the generating and the collimating, the filtering achieved by a filter, the filter enclosed separately from the collimator, the filtering performed such that:

in a cargo configuration, the filtering provides a cargo inspection dose for inspection by irradiation of a container of the vehicle by the inspection beam, the container being configured to contain cargo, and in an attenuation configuration, the filtering attenuates the radiation dose to a cabin inspection dose reduced compared to the cargo inspection dose yet enabling inspection by irradiation of a cabin of the vehicle by the inspection beam, the cabin being configured to be occupied by a user; and controlling the configuration of the filtering, such that the filtering is:

in the cargo configuration when the inspection beam irradiates the container, and in the attenuation configuration when the inspection beam irradiates the cabin.

15. The inspection method of claim 14, comprising moving the inspection system and the vehicle relative to one another, or one relative the other, during an inspection of the vehicle located in the zone of inspection, and further comprising controlling the configuration of the filtering based on at least one of:

a detection of the cabin and/or the container in the zone of inspection;

a time elapsed since a time of the detection of the cabin and/or the container in the zone of inspection;

a distance covered by the vehicle since the detection of the cabin and/or the container in the zone of inspection;

a geometrical profile of the vehicle.

16. The inspection method of claim 14, further comprising:

filtering in the attenuation configuration as a default configuration.

17. The inspection method of claim 14, comprising providing a filter in a casing which is distinct from respective casings of the source and the collimator.

18. The inspection method of claim 14, comprising attenuating less and less of the radiation dose as the configuration of the filtering is modified from the attenuation configuration to the cargo configuration.

19. The inspection method of claim 14, comprising irradiating the cabin whilst the cabin is occupied by the user.

20. The inspection method of claim 14, comprising reducing the cabin inspection dose by a factor comprised between 2 and 100 compared to the cargo inspection dose.

* * * * *